(12) United States Patent
Pan

(10) Patent No.: US 7,596,195 B2
(45) Date of Patent: Sep. 29, 2009

(54) BANDPASS FILTER WITH REVERSIBLE IQ POLARITY TO ENABLE A HIGH SIDE OR LOW SIDE INJECTION RECEIVER ARCHITECTURE

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 822 days.

(21) Appl. No.: 10/865,951

(22) Filed: Jun. 14, 2004

(65) Prior Publication Data

US 2005/0220223 A1 Oct. 6, 2005

Related U.S. Application Data

(63) Continuation-in-part of application No. 10/813,270, filed on Mar. 31, 2004.

(51) Int. Cl.
*H04B 1/10* (2006.01)
(52) U.S. Cl. .................. 375/350; 375/351; 375/240.29; 327/551; 327/552; 327/558
(58) Field of Classification Search .......... 375/229, 375/240.02–240.07, 240.29, 350, 351; 327/551–559
See application file for complete search history.

(56) References Cited

U.S. PATENT DOCUMENTS

| | | | |
|---|---|---|---|
| 4,724,407 A | 2/1988 | Miura et al. | |
| 4,857,778 A | 8/1989 | Hague | |
| 4,866,779 A | 9/1989 | Kennedy et al. | |
| 4,914,408 A | 4/1990 | Voorman | |
| 4,928,315 A | 5/1990 | Jensen et al. | |
| 4,965,853 A * | 10/1990 | Barnard | 455/209 |
| 5,028,893 A | 7/1991 | Marrah et al. | |
| 5,140,703 A | 8/1992 | Payne | |
| 5,285,502 A | 2/1994 | Walton et al. | |
| 5,307,372 A | 4/1994 | Sawyer et al. | |
| 5,535,283 A | 7/1996 | Saruta et al. | |
| 5,629,655 A | 5/1997 | Dent | |
| 5,726,974 A | 3/1998 | Kunieda et al. | |
| 5,933,448 A | 8/1999 | Katisko | |
| 6,055,282 A | 4/2000 | Hughes et al. | |
| 6,370,370 B1 | 4/2002 | Roth et al. | |
| 6,437,639 B1 | 8/2002 | Nguyen et al. | |
| 6,441,682 B1 * | 8/2002 | Vinn et al. | 327/552 |
| 6,445,735 B1 | 9/2002 | Whikehart | |
| 6,559,740 B1 | 5/2003 | Schultz | |
| 6,577,855 B1 | 6/2003 | Moore et al. | |
| 6,633,550 B1 * | 10/2003 | Gardenfors et al. | 370/280 |
| 6,892,060 B2 | 5/2005 | Zheng | |
| 6,917,252 B1 * | 7/2005 | Wyszynski | 333/17.1 |
| 7,098,731 B1 * | 8/2006 | Wyszynski | 327/557 |
| 7,120,416 B2 | 10/2006 | Tomita | |
| 7,138,873 B2 | 11/2006 | Chandra et al. | |
| 7,171,185 B2 | 1/2007 | Matsumoto et al. | |
| 7,376,409 B2 | 5/2008 | Pan | |

(Continued)

FOREIGN PATENT DOCUMENTS

DE 32 23 904 A1 12/1983

(Continued)

OTHER PUBLICATIONS

EP Search Report, dated Jul. 26, 2005 for EP Patent Application No. EP05004477.5, 3 pages.

*Primary Examiner*—David C Payne
*Assistant Examiner*—Linda Wong
(74) *Attorney, Agent, or Firm*—Sterne, Kessler, Goldstein & Fox P.L.L.C.

(57) ABSTRACT

The invention enables a reversing IQ polarity in a bandpass filter so that the bandpass filter can filter signals with high side or low side injection.

20 Claims, 7 Drawing Sheets

U.S. PATENT DOCUMENTS

| | | |
|---|---|---|
| 2001/0001759 A1 | 5/2001 | Holden et al. |
| 2002/0071173 A1 | 6/2002 | Lee et al. |
| 2002/0094037 A1 | 7/2002 | Darabi et al. |
| 2002/0115420 A1 | 8/2002 | Cheng |
| 2003/0016761 A1 | 1/2003 | Min |
| 2003/0017817 A1 | 1/2003 | Cowley |
| 2003/0064695 A1 | 4/2003 | Shi |
| 2003/0165203 A1 | 9/2003 | Mohindra |
| 2004/0002311 A1 | 1/2004 | Feng |
| 2004/0247132 A1 | 12/2004 | Klayman et al. |
| 2004/0266369 A1 | 12/2004 | McCallister |
| 2005/0118975 A1 | 6/2005 | Ismail |
| 2005/0221783 A1 | 10/2005 | Pan |
| 2005/0221788 A1 | 10/2005 | Pan |
| 2005/0221789 A1 | 10/2005 | Pan |
| 2006/0153403 A1 | 7/2006 | Lechner |

FOREIGN PATENT DOCUMENTS

| | | |
|---|---|---|
| EP | 0 542 520 A2 | 5/1993 |
| EP | 0 797 292 A1 | 9/1997 |
| EP | 0 948 128 A1 | 10/1999 |

* cited by examiner

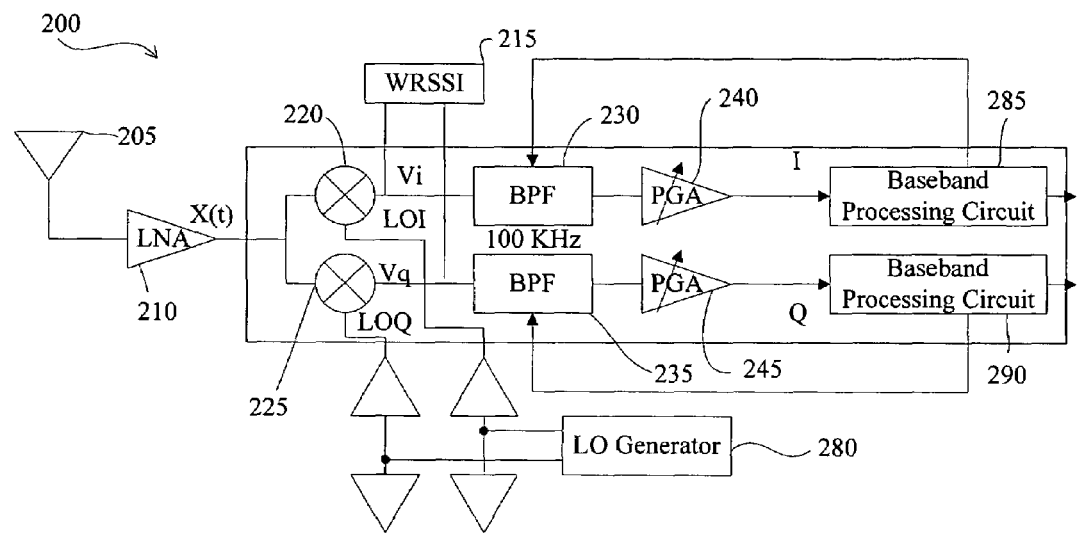
FIG. 2
If Wlo > Wrf => Wif=Wlo-Wrf > 0
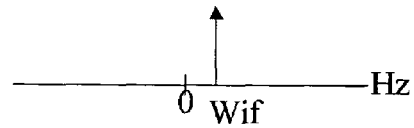
FIG. 3A
Need complex IF filter with center >0
FIG. 3B
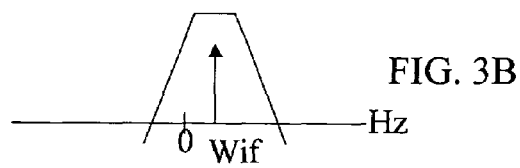
If Wlo<WRf => Wif=Wlo-Wrf<0
FIG. 3C
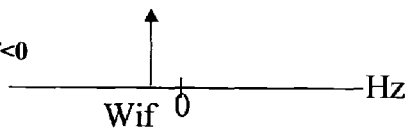
Need complex IF filter with center <0
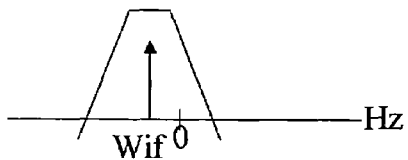
FIG. 3D IQ_select=1

Turn on s1 and s4
Turn off s2 and s3

Turn on s1 and s4
Turn off s2 and s3

IQ_select=0

Iin                                      Iout=Iin

Turn on s1 and s4

Turn off s2 and s3

Qin                                      Qout=-Qin

Turn on s2 and s3

Turn off s1 and s4

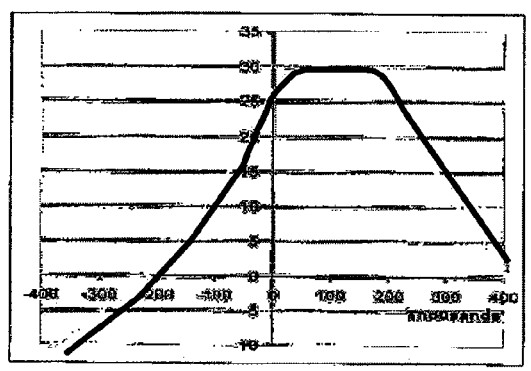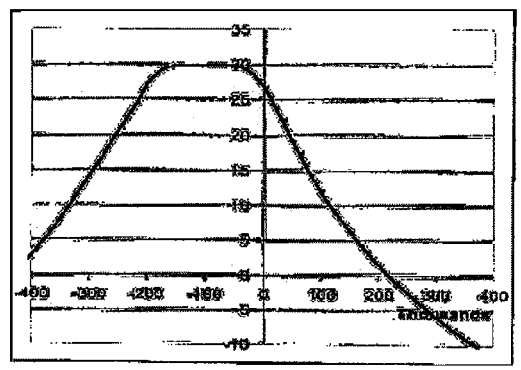
IQ_select=1  
Center=Wc  
Wif>0  
FIG. 9A
IQ_Select = 0  
Center=-Wc  
Wif<0  
FIG. 9B

BANDPASS FILTER WITH REVERSIBLE IQ POLARITY TO ENABLE A HIGH SIDE OR LOW SIDE INJECTION RECEIVER ARCHITECTURE

CROSS REFERENCE TO RELATED APPLICATION

This application is a continuation-in-part of, and incorporates by reference, U.S. patent application Ser. No. 10/813,270, filed Mar. 31, 2004, entitled "Programmable IF Frequency Filter For Enabling A Compromise Between DC Offset Rejection And Image Rejection" by inventor Meng-An Pan.

BACKGROUND

1. Technical Field

This invention relates generally to wireless communication systems, and more particularly, but not exclusively, to a bandpass filter with reversible IQ polarity that enables a high or low side injection receiver architecture.

2. Description of the Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data to RF carrier in accordance with the particular wireless communication standard and directly or in one or more intermediate frequency stages to produce the RF signals.

Heterodyne receivers can be either high side injection (LO frequency>RF frequency) or low side injection (LO frequency<RF frequency). The IF frequency, $W_{IF}$, equals LO frequency, $W_{LO}$, minus the RF frequency, $W_{RF}$. The downconverted signals can thus have IF frequency greater than zero (high side injection) or have IF frequency less than zero (low side injection).

Accordingly, a new filter and method is presented that enables reversible IQ polarity in a BPF so as to accommodate either high or low side injection.

SUMMARY

Embodiments of the invention incorporate a reversible IQ polarity capability in a BPF, thereby enabling filtering of either high or low side injection signals.

In an embodiment of the invention, a system comprises a mixer and a bandpass filter. The mixer down shifts a received signal to an IF frequency ($W_{IF}$) and then the bandpass filter, which is communicatively coupled to the filter, does channel selection and filters out any unwanted signals. If the IF frequency is positive, the bandpass filter will have a positive center frequency ($Wc=W_{IF}>0$). If the IF frequency is negative the bandpass can be programmed to have a negative center frequency ($Wc=W_{IF}<0$).

In an embodiment of the invention, a method comprises: down shifting a received signal to an IF frequency, programming the center frequency of a bandpass filter to be a positive or negative value dependent on whether the IF frequency is positive or negative; and filtering the signal.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2 is a block diagram illustrating a receiver;

FIGS. 3A-3D are diagrams illustrating BPF center frequency based on down conversion frequency;

FIGS. 9A and 9B are simulation charts illustrating the center frequency of the BPF without and with reversed polarity, respectively.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
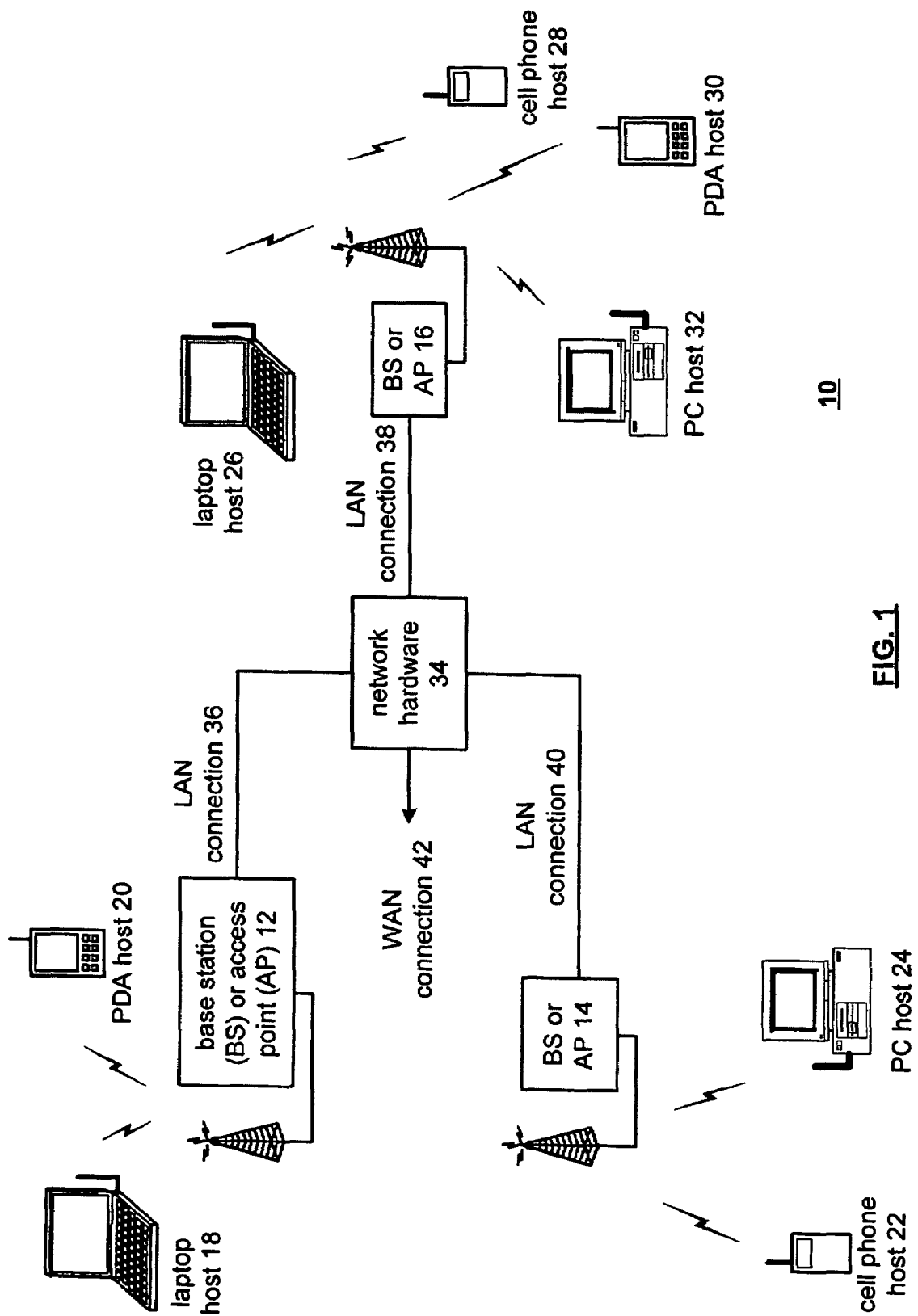
FIG. 1 is a block diagram illustrating a network system according to an embodiment of the present invention.

FIG. 1 is a block diagram illustrating a network system 10 according to an embodiment of the present invention. The system 10 includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28.

The base stations or access points 12 are operably coupled to the network hardware 34 via local area network connections 36, 38 and 40. The network hardware 34, which may be a router, switch, bridge, modem, system controller, etc. provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a transmitter capable of adjusting power amplifier output power and therefore has characteristics of reduced power requirements, thereby extending the life of an associated power supply.

FIG. 2 is a circuit diagram illustrating a receiver 200 with low-intermediate frequency, which is 100 KHz in this embodiment. An antenna 205 is coupled to a low noise amplifier (LNA) 210, which is coupled to down converters (mixers) 220 and 225. The down converters 220 and 225 are coupled to bandpass filters (BPFs) 230 and 235, respectively, which are coupled to programmable gain amplifiers 240 and 245, respectively. The gain amplifiers 240 and 245 output analog signals to baseband digital processing circuits 285 and 290, respectively. Further, an LO generator 280 is coupled to the down converters 220 and 225. A wideband radio signal strength indicator (WRSSI) 215 is coupled to connections between the down converters 220 and 225 and the bandpass filters 230 and 235.

The antenna 205 receives signals and passes the signals to the LNA 210, which amplifies the received signals and passes them to the down converters 220 and 225, which shifts the frequency of the received signals downwards. The BPFs 230 and 235 discriminate against unwanted frequencies outside of a selected band. The BPFs 230 and 235 also perform channel selection to compromise between image rejection and DC offset rejection and further perform gain functions.

In an embodiment of the invention, each BPF 230 and 235 can comprise 3 biquads with configurations as shown in Table I below.

TABLE I (Center Frequency of 100 KHz)

|  | Biquad1 | Biquad2 | Biquad3 |
|---|---|---|---|
| Center Frequency | 100 KHz | 186 KHz | 13.4 KHz |
| BW | 200 KHz | 100 KHz | 100 KHz |
| Q | 0.5 | 1.866 | 0.134 |
| Gain Setting | 20 dB, 0 dB | 10 dB, 0 dB | 0 dB |
| 30 dB | 20 dB | 10 dB | 0 dB |
| 20 dB | 20 dB | 0 dB | 0 dB |
| 10 dB | 0 dB | 10 dB | 0 dB |
| 0 dB | 0 dB | 0 dB | 0 dB |
| Current | 1.7 mA (I and Q) | 1.7 mA (I and Q) | 1.7 mA (I and Q) |

Each BPF 230 and 235 can have gain settings of 30 dB, 20 dB, 10 dB and 0 dB. IF can be centered at 112 KHz, 108 KHz, 104 KHz, and 100 KHz. Further, the BPFs 230 and 235 can change the IQ polarity, as will be discussed further below. Control words for changing IQ polarity are shown in Table II below.

TABLE II (Control Words for IQ Polarity)

| IQ_select | IQ Polarity | BPF Shape |
|---|---|---|
| 1 | I = I, Q = Q | Wif = 100 KHz |
| 0 | I = I, Q = Qbar | Wif = −100 KHz |

Figure 4:
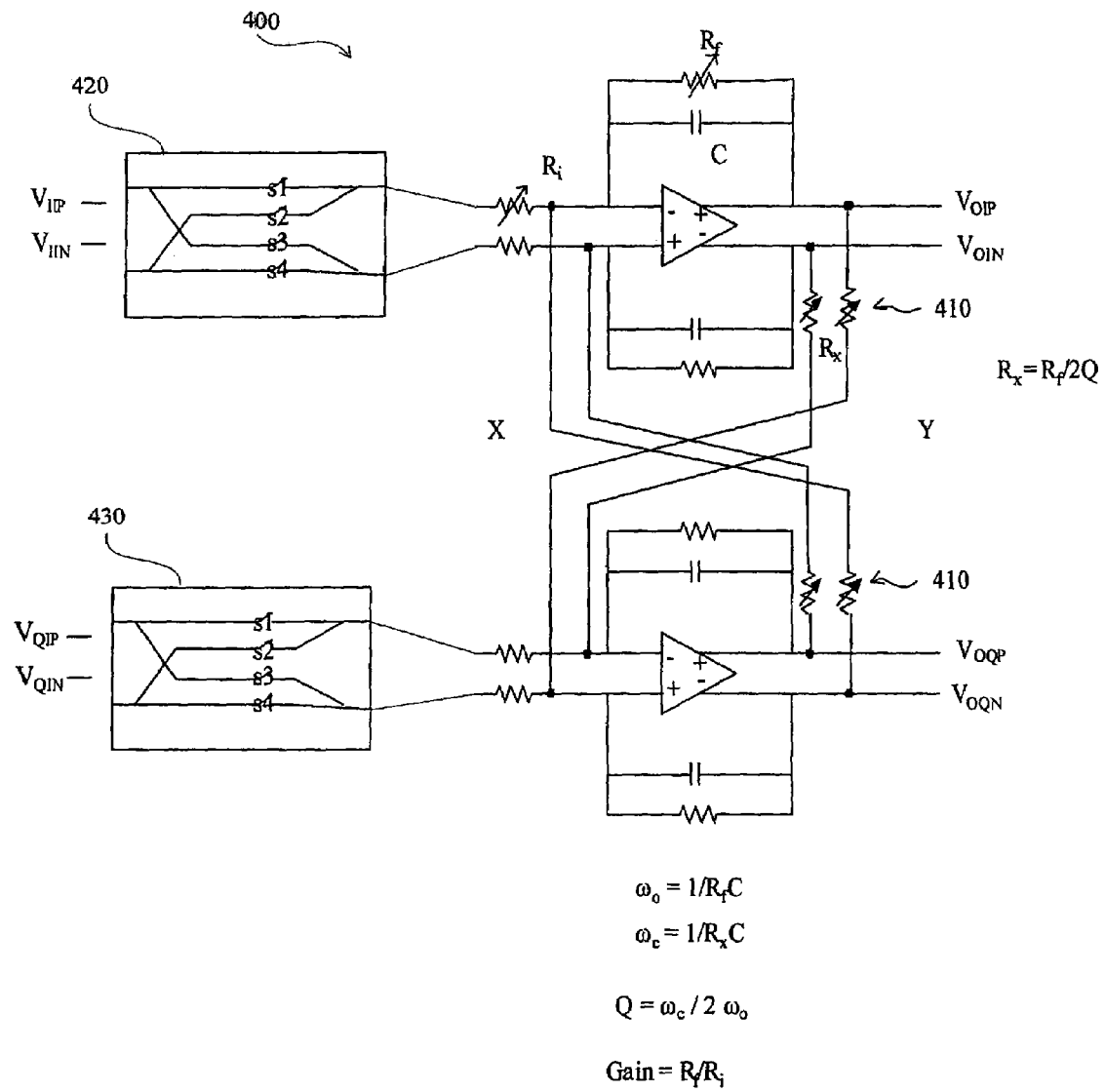
FIG. 4 is a diagram illustrating a channel select filter (bandpass filter) of the receiver IF section of FIG. 2.

Control words will vary the coupling resistor 410 values, which is $R_x$, in FIG. 4, and change the IF frequency of the channel select filter 400. Control words for changing the channel selection (frequency selection) of the BPFs 230 and 235 are shown in Table III below.

TABLE III

| BPF Center Frequency | Center Frequency Control Word (4 bit) |
|---|---|
| 112 KHz | 1000 |
| 108 KHz | 0100 |
| 104 KHz | 0010 |
| 100 KHz | 0001 |

Control words also vary $R_f$ and $R_i$ (FIG. 4) values to change the gain of the bandpass filter 230 and 235. In an embodiment of the invention, the BPFs 230 and 235 can have variable gain from 0 db to 30 db in 10 db steps. Control words for the varying gain are shown in Table IV below. It will be appreciated by one of ordinary skill in the art that the gain settings are not limited to the values shown in Table IV.

TABLE IV

| Gain | Gain Control Word (2 bit) | Noise Figure @ 100 KHz |
|---|---|---|
| 30 db | 11 | 18.9 |
| 20 db | 10 | 21 |
| 10 db | 01 | 39 |
| 0 db | 00 | 41 |

The LO generator 280 determines how to bring an incoming RF signal received at the antenna 205 down to 100 KHz. The PGAs 240 and 245 increase the gain of the BPFs 230 and 235 output. The baseband digital processing circuits 285 and 290 convert analog signals from the PGAs 240 and 245 to digital data and determine if the current gain is adequate (e.g., if signal to noise ratio too low). The baseband digital processing circuits 285 and 290 then adjust the BPF 230 and 235 gain function accordingly by varying $R_f$ and $R_i$ (FIG. 4). In an embodiment of the invention, the receiver 200 can include measurement circuits (not shown) in place of or in addition to the baseband digital processing circuits 285 and 290 that measure the DC offset rejection and image rejection of the filtered signals and provide feedback to the BPFs 230 and 235 so that a new IF frequency can be chosen to form a better compromise between DC offset rejection and image rejection.

FIG. 3A-3D are diagrams illustrating BPF center frequency based on down conversion frequency. As shown in FIG. 3A, when Wlo (LO frequency) is greater than Wrf (received frequency), Wif=Wlo−Wro will be positive. Accordingly, a BPF with a positive center frequency will be required to filter Wif. Further, as shown in FIG. 3C, when Wlo<Wrf, then Wif=Wlo−Wrf will be negative, necessitating the need for a BPF with a negative center frequency.

For a low pass filter:

$$\frac{y}{x} = \frac{Gain}{1 + j\frac{\omega}{\omega_0}},$$

wherein $\omega_o$ is the corner frequency. For a bandpass filter:

$$\frac{y}{x} = \frac{Gain}{1 + j\frac{(\omega - \omega_c)}{\omega_0}},$$

wherein $\omega_c$ is the center frequency. For the channel select filter electrical equivalent 600 (FIG. 6A):

$$\frac{y}{x} = \frac{Gain}{j\frac{W}{W_0} + 1 - j2Q} = \frac{Gain}{1 + j\left(\frac{\omega}{\omega_o} - 2Q\right)} = \frac{Gain}{1 + j\frac{\omega - 2Q\omega_o}{\omega_o}} = \frac{Gain}{1 + j\frac{\omega - \omega_c}{\omega_o}}$$

$$\omega_o = \frac{1}{R_f C}$$

$$\text{Center frequency} = \omega_c = \frac{1}{R_x C}$$

$$Q = \frac{\omega_c}{2\omega_o}$$

$$Gain = \frac{R_f}{R_i}$$

In contrast, for the channel select filter equivalent 800 (FIG. 8A):

$$\frac{y}{x} = \frac{Gain}{j\frac{W}{W_0} + 1 + j2Q} = \frac{Gain}{1 + j\left(\frac{\omega}{\omega_o} + 2Q\right)} = \frac{Gain}{1 + j\frac{\omega + 2Q\omega_o}{\omega_o}} = \frac{Gain}{1 + j\frac{\omega + \omega_c}{\omega_o}}$$

$$\omega_o = \frac{1}{R_f C}$$

$$\text{Center frequency} = \omega_c = \frac{-1}{R_x C}$$

$$Q = \frac{\omega_c}{2\omega_o}$$

$$Gain = \frac{R_f}{R_i}$$

$$\frac{y}{x} = \frac{Gain}{1 + j\frac{(\omega + \omega_c)}{\omega_o}}$$

The filter 400 is an active RC filter that enables achievement of a high dynamic range. The filter 400 comprises two cross coupled low pass filters having cross coupled variable resistors 410, each having a resistance $R_x$. As derived above, variation of $R_x$ shifts the bandpass filter IF frequency up or down. Specifically, the IF frequency of the filter 400 is inversely proportional to $R_x$. In addition, variation of a feedback resistor, $R_f$, and of an input resistor, $R_i$, enable changes in gain of the filter 400 as gain is equal to $R_f/R_i$.

$R_f$ and $R_i$ are set to default values (e.g., zero gain) initially and gain, if any, is applied. After filtering and amplification (by the PGAs 240, 245), the baseband digital processing circuits 285 and 290 determine if the gain is adequate based on the signal to noise ratio. If the gain is insufficient because of BPF 230 or 235 noise is being amplified, then the baseband digital processing circuits 285 and 290 provide feedback to the BPFs 230 and 235 and $R_f$ and $R_i$ are adjusted to increase gain in the BPFs 230 and 235.

In order to reverse polarities to move the BPF 400 center frequency from positive to negative, the BPF 400 includes switching devices 420 and 430. The switching device 420 is coupled to the inputs of a first LPF that is a cross-coupled to a second LPF to form the BPF 400. The switching device 430 is coupled to the second LPF. In an embodiment of the invention, the BPF 400 does not include the switching device 420. Each switching device 420 and 430 include 4 switches s1-s4. Switches s2 and s3 of each switching device 420 and 430 enable the cross-coupling of inputs while the switches s1 and s4 enable straight input without cross-coupling. Specifically, the switches s2 and s3 of the switching device 420 reverse the inputs of $V_{IIp}$ and $V_{IIN}$, while the switches s2 and s3 of the switching device 430 reverse the inputs of $V_{QIP}$ and $V_{QIN}$.

Figure 5A:
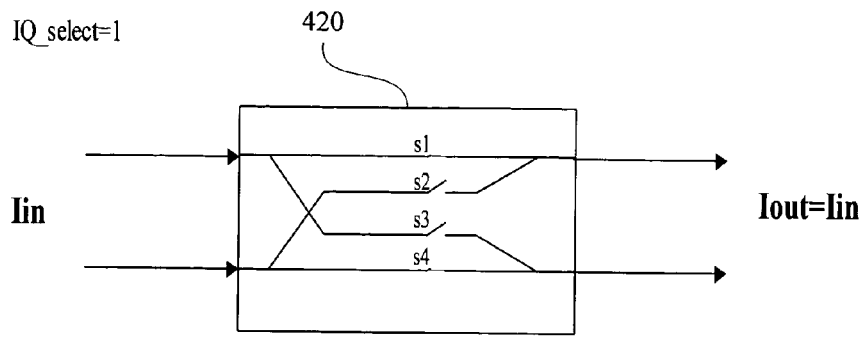
FIGS. 5A and 5B are diagrams illustrating the switching devices of the BPF when polarity is not reversed.
Figure 5B:
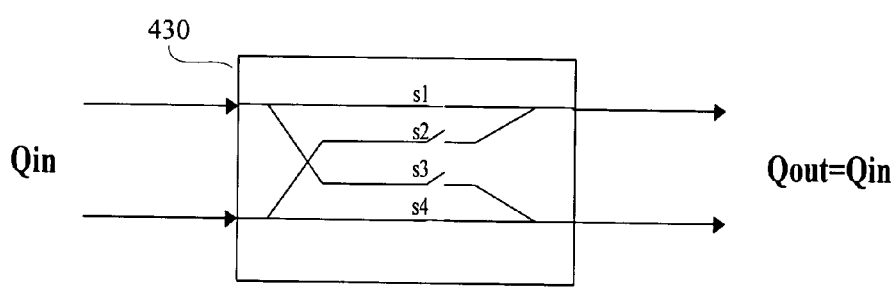

FIGS. 5A and 5B are diagrams illustrating the switching devices 420 and 430 of the BPF 400 when polarity is not reversed (i.e., IQ_select=1). When polarity is not reversed (e.g., the BPF 400 center frequency is positive), the switches s1 and s4 of both the switching devices 420 and 430 are activated to enable straight pass through of signals to the BPF 400 with no cross-coupling. Accordingly, $I_{out}=I_{in}$ and $Q_{out}=Q_{in}$.

Figure 6A:
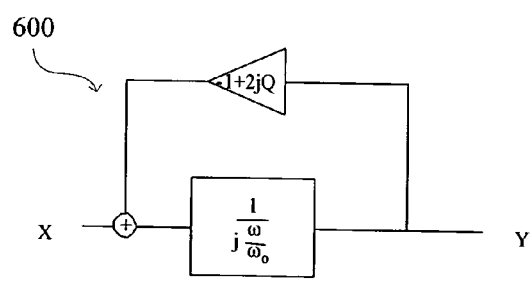
FIGS. 6A and 6B are diagrams illustrating a signal flow diagram of the BPF without reversed polarity and the center frequency of the BPF.
Figure 6B:
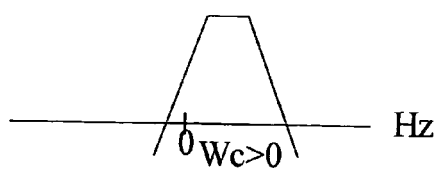

FIGS. 6A and 6B are diagrams illustrating a signal flow diagram of the BPF 400 without reversed polarity and the center frequency of the BPF. When IQ_select=1, , the signal flow diagram of the BPF 400 becomes the circuit 600 as shown in FIG. 6A. Therefore, the center frequency of the BPF is positive, as shown in FIG. 7B.

Figure 7A:
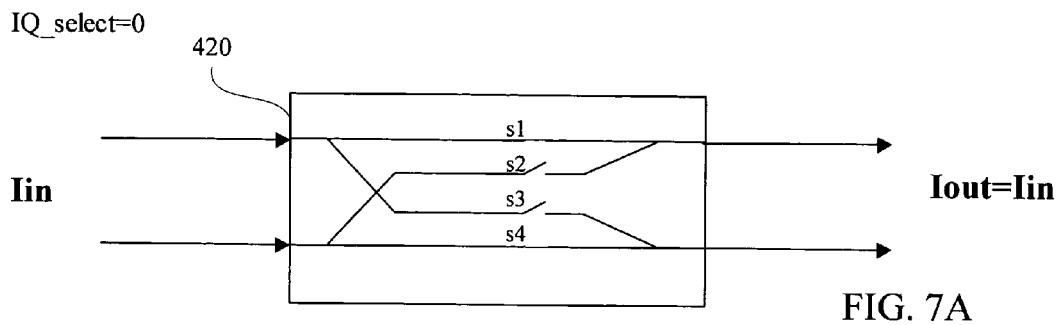
FIGS. 7A and 7B are diagrams illustrating the switching devices of the BPF when polarity is not reversed.
Figure 7B:
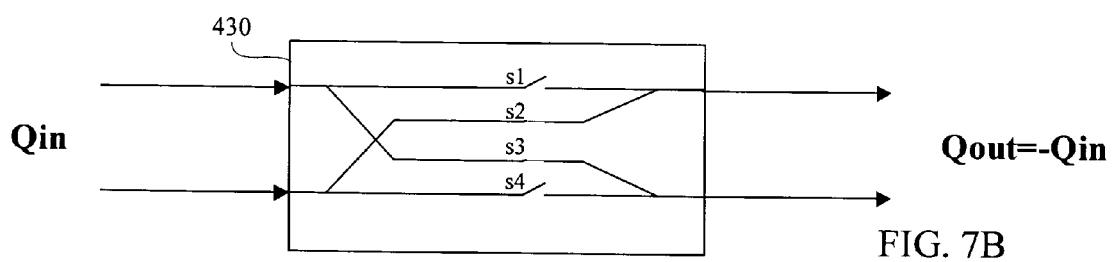

FIGS. 7A and 7B are diagrams illustrating the switching devices 420 and 430 of the BPF 400 when polarity is reversed (i.e., IQ_select=0). When polarity is reversed (e.g., the BPF 400 center frequency is negative), the switches s1 and s4 of the switching devices 420 are activated to enable straight pass through of signals to the BPF 400 with no cross-coupling. However, the switches s2 and s3 of the switching device 430 is activated to enabling cross-coupling, thereby reversing the inputs of Qin. Accordingly, $I_{out}=I_{in}$ and $Q_{out}=-Q_{in}$.

Figure 8A:
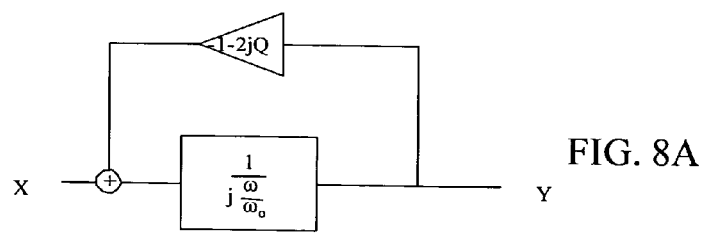
FIGS. 8A and 8B are diagrams illustrating a signal flow diagram of the BPF without reversed polarity and the center frequency of the BPF.
Figure 8B:
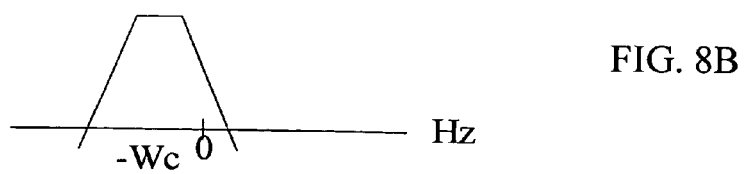

FIGS. 8A and 8B are diagrams illustrating a signal flow diagram of the BPF 400 with reversed polarity and the center frequency of the BPF. When IQ_select=0, the signal flow diagram of the BPF 400 becomes the circuit 800 as shown in FIG. 8A. Therefore, the center frequency of the BPF is negative, as shown in FIG. 8B.

FIGS. 9A and 9B are simulation charts illustrating the center frequency of the BPF 400 without and with reversed polarity, respectively. When IQ_select=1 (high side injection), the center frequency of the BPF 400 is positive, as shown in FIG. 9A. When IQ_select=0 (low side injection), the center frequency of the BPF 400 is negative, as shown in FIG. 9B. Accordingly, the BPF 400 can perform filtering for either high side or low side injection.

Figure 10:
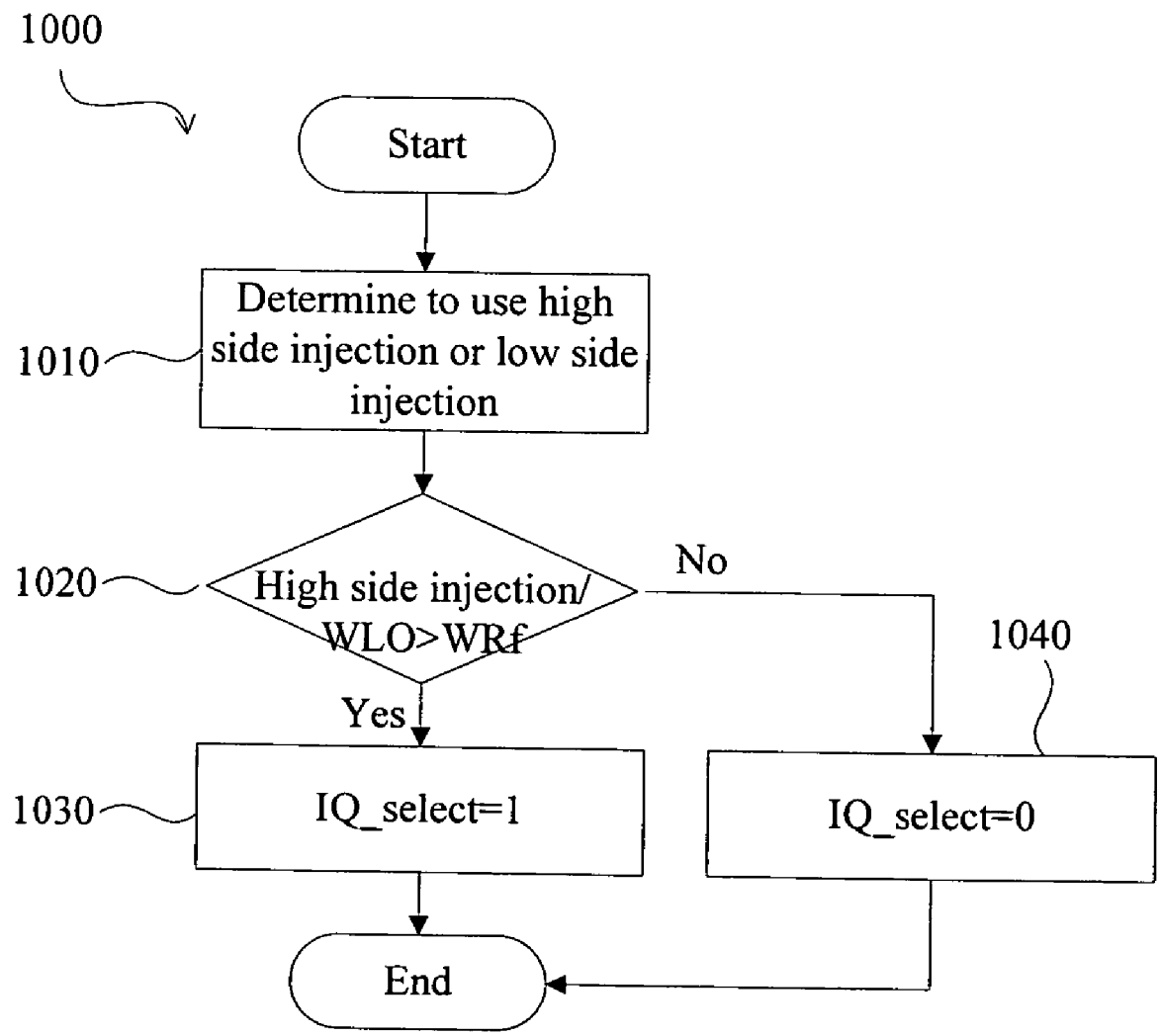
FIG. 10 is a flowchart illustrating a method of changing a center frequency of a BPF by reversing polarity.

FIG. 10 is a flowchart illustrating a method 1000 of changing a center frequency of a BPF by reversing polarity. First, a heterodyne receiver determines (1010) to use either high side injection or low side injection. If (1020) high injection is used then Wlo is set to be higher than the Wrf, and then Wif will be greater than 0. Accordingly IQ_select is set (1030) to 1 to center the BPF at a positive frequency. Else if low injection is used then Wlo is set to be lower than the Wrf, and then Wif will be less than 0. Accordingly, IQ_select is set (104) to 0 to center the BPF at negative frequency. The method 1000 then ends.

The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A method, comprising:
   (a) down shifting a received signal, having a first component and a second component, the first component having a first positive component and a first negative component, to provide a down shifted signal;
   (b) activating a first switch to enable straight pass through of the second component to a first low pass filter and activating a second switch to enable cross-coupling of the first positive component with the first negative component to a second low pass filter, the first and second switches and the first and second low pass filters being configured to form a bandpass filter, to shift a center frequency of the bandpass filter to a negative value from a positive value if the down shifted signal has a negative frequency; and
   (c) using first low pass filter to filter the second component and the second low pass filter to filter the first component.

2. The method of claim 1, wherein the shifting causes the center frequency to invert from the positive value to the negative value.

3. The method of claim 1, wherein the first low pass filter is cross-coupled to the second low pass filter.

4. An apparatus, comprising:
   a mixer configured to down shift a received signal, having a first component and a second component, the first component having a first positive component and a first negative component, to provide a down shifted signal; and
   a bandpass filter configured to filter the down shifted signal; the bandpass filter including:
      a first switch configured to enable straight pass through of the second component to a first low pass filter, and
      a second switch configured to enable cross-coupling of the first positive component with the first negative component to a second low pass filter, the first and second switches and the first and second low pass filters being configured to form a bandpass filter, to shift a center frequency of the bandpass filter to a negative value from a positive value if the down shifted signal has a negative frequency.

5. The system of claim 4, wherein the bandpass filter is configured such that the shifting causes the center frequency to invert from the positive value to the negative value.

6. The system of claim 4, wherein the first low pass filter is cross-coupled to the second low pass filter.

7. The method of claim 1, wherein the second component of the received signal includes a second positive component and a second negative component, and wherein step (b) comprises:
   (b)(i) activating the first switch to enable straight pass through of the second positive component and the second negative component to provide a straight pass through input; and
   (b)(ii) activating the second switch to enable the cross-coupling of the first positive component and the first negative component to provide a cross-coupled input.

8. The method of claim 7, wherein step (b)(ii) comprises:
   (b)(ii)(A) coupling the first positive component to a first input of the first low pass filter corresponding to the first negative component; and
   (b)(ii)(B) coupling the first negative component to a first input of the first low pass filter corresponding to the first positive component.

9. The method of claim 7, wherein step (c) comprises:
   (c)(i) filtering the straight pass through input and the cross-coupled input.

10. The method of claim 1, wherein step (a) comprises:
    (a)(i) down shifting the second component of the received signal using a first mixer; and
    (a)(ii) down shifting the first component of the received signal using a second mixer.

11. The method of claim 1, further comprising:
    (d) activating the first switch to enable the straight pass through of the second component to the bandpass filter and activating a third switch to enable the straight pass through of the first component to the bandpass filter if the down shifted signal has the positive frequency.

12. The method of claim 11, wherein the second component of the received signal includes a second positive component and a second negative component, and wherein step (d) comprises:
- (d)(i) activating the first switch to enable straight pass through of the second positive component and the second negative component to provide a first straight pass through input; and
- (d)(ii) activating the third switch to enable straight pass through of the first positive component and the first negative component to provide a second straight pass through input.

13. The method of claim 7, wherein step (c) comprises:
- (c)(i) filtering the first straight pass through input and the second straight pass through input.

14. The apparatus of claim 4, wherein the second component of the received signal includes a second positive component and a second negative component, and wherein the first switch is configured to enable straight pass through of the second positive component and the second negative component to provide a straight pass through input and the second switch is configured to enable the cross-coupling of the first positive component and the first negative component to provide a cross-coupled input.

15. The apparatus of claim 14, wherein the second switch is configured to couple the first positive component to a first input of the first low pass filter corresponding to the first negative component and to couple the first negative component to a first input of the first low pass filter corresponding to the first positive component.

16. The apparatus of claim 14, wherein the first low pass filter is configured to filter the straight pass through input and the cross-coupled input.

17. The apparatus of claim 4, wherein the mixer comprises:
- a first mixer configured to down shift the second component of the received signal; and
- a second mixer configured to down shift the first component of the received signal.

18. The apparatus of claim 4, wherein the first switch is configured to enable the straight pass through of the second component to the bandpass filter, and wherein the bandpass filter further includes:
- a third switch configured to enable the straight pass through of the first component to the bandpass filter if the down shifted signal has the positive frequency.

19. The apparatus of claim 18, wherein the second component of the received signal includes a second positive component and a second negative component, and wherein the first switch is configured to enable straight pass through of the second positive component and the second negative component to provide a first straight pass through input, and the third switch is configured to enable straight pass through of the first positive component and the first negative component to provide a second straight pass through input.

20. The method of claim 7, wherein the first low pass filter is configured to filter the first straight pass through input and the second low pass filter is configured to filter the second straight pass through input.

* * * * *

UNITED STATES PATENT AND TRADEMARK OFFICE
CERTIFICATE OF CORRECTION

PATENT NO.         : 7,596,195 B2                                              Page 1 of 1
APPLICATION NO.    : 10/865951
DATED              : September 29, 2009
INVENTOR(S)        : Meng-An Pan It is certified that error appears in the above-identified patent and that said Letters Patent is hereby corrected as shown below:

Column 8, line 4, "using first low pass filer" should be replaced by --using the first low pass filter--.

Column 8, lines 18-19, "down shifted signal; the bandpass filter including" should be replaced by --down shifted signal, the bandpass filter including--.

Signed and Sealed this

Twenty-fifth Day of May, 2010

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,596,195 B2 |
| APPLICATION NO. | : 10/865951 |
| DATED | : September 29, 2009 |
| INVENTOR(S) | : Ming-An Pan |

It is certified that error appears in the above-identified patent and that said Letters Patent is hereby corrected as shown below:

Title page, item (*) Notice: Delete "822 days" and insert -- 1491 days --.

Signed and Sealed this

Twenty-fourth Day of August, 2010

David J. Kappos
*Director of the United States Patent and Trademark Office*